(12) United States Patent
Kawaguchi

(10) Patent No.: US 8,558,361 B2
(45) Date of Patent: Oct. 15, 2013

(54) POWER SEMICONDUCTOR MODULE

(75) Inventor: Yasuto Kawaguchi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 191 days.

(21) Appl. No.: 12/910,231

(22) Filed: Oct. 22, 2010

(65) Prior Publication Data

US 2011/0249407 A1    Oct. 13, 2011

(30) Foreign Application Priority Data

Apr. 12, 2010    (JP) ................................. 2010-091291

(51) Int. Cl.
*H01L 23/495* (2006.01)
(52) U.S. Cl.
USPC ........... 257/675; 257/688; 257/704; 257/706; 257/E29.119; 257/E23.101; 257/E23.12
(58) Field of Classification Search
USPC .......... 257/675, 688, 704, 706, 795, E29.119, 257/E23.101, E23.12
See application file for complete search history.

(56) References Cited

U.S. PATENT DOCUMENTS

| | | | | |
|---|---|---|---|---|
| 4,855,872 A | * | 8/1989 | Wojnar et al. | ................. 361/792 |
| 6,231,919 B1 | | 5/2001 | Craton | |
| 7,514,777 B2 | | 4/2009 | Kawaguchi et al. | |
| 7,879,455 B2 | * | 2/2011 | Kajiwara et al. | ............. 428/620 |
| 2007/0246833 A1 | | 10/2007 | Soga et al. | |

FOREIGN PATENT DOCUMENTS

| | | |
|---|---|---|
| DE | 43 41 269 A1 | 6/1995 |
| DE | 10 2007 015 534 A1 | 4/2008 |
| DE | 10 2007 008 912 B4 | 1/2009 |
| EP | 0 706 221 A2 | 4/1996 |
| FR | 2 800 017 A1 | 4/2001 |
| JP | 8-125071 | 5/1996 |
| JP | 11-87567 | 3/1999 |
| JP | 2002-76190 | 3/2002 |
| JP | 2004-214294 | 7/2004 |
| JP | 2006-032617 | 2/2006 |
| JP | 2007-329362 | 12/2007 |
| JP | 2009-070863 | 4/2009 |
| JP | 2009-070869 | 4/2009 |

OTHER PUBLICATIONS

Office Action issued Dec. 4, 2012 in Japanese Application No. 2010-091291 filed Apr. 12, 2010 (w/English translation).
Office Action issued Dec. 21, 2012 in Chinese Application No. 201110073649.2 (w/partial English translation).
Office Action issued on Jun. 27, 2013 in German Application No. 10 2011 005 690.4 with English translation.

* cited by examiner

*Primary Examiner* — Michelle Mandala
(74) *Attorney, Agent, or Firm* — Oblon, Spivak, McClelland, Maier & Neustadt, L.L.P.

(57) ABSTRACT

A power semiconductor module comprises: a heat dissipation plate; an insulating wiring board having an upper electrode and a lower electrode, the lower electrode joined to the heat dissipation plate via a first solder; a semiconductor chip joined to the upper electrode via a second solder; a first low-k dielectric film coating sides of the lower electrode and the first solder; a second low-k dielectric film coating sides of the semiconductor chip and the second solder; a case on the heat dissipation plate and surrounding the insulating wiring board and the semiconductor chip; and an insulator filled in the case and coating the insulating wiring board, the semiconductor chip, and the first and second low-k dielectric films.

8 Claims, 5 Drawing Sheets

POWER SEMICONDUCTOR MODULE

BACKGROUND OF THE INVENTION

1. Field of the Invention

The present invention relates to a power semiconductor module comprising a double-sided electrode type insulating wiring board, and in particular to a power semiconductor module capable of reducing insulation failure.

2. Background Art

In recent years, a power semiconductor module is used in a power converter for controlling electrical equipment such as motors. In the power semiconductor module, a double-sided electrode type insulating wiring board joined on a heat dissipation plate with a solder, and semiconductor chips are joined on the insulating wiring board with the solder. A case capsules the insulating wiring board and semiconductor chips, and the case is filled with silicone gel (for example, refer to Japanese Patent Laid-Open No. 2002-76190).

SUMMARY OF THE INVENTION

Bubbles may be formed from a solder into the silicone gel in the circumferential part of the module due to temperature change when applying current. By these bubbles, insulation failure may occur. Particularly, bubbles in the circumferential part of the double-sided electrode type insulating wiring board joined on the heat dissipation plate directly cause insulation failure.

In view of the above-described problems, an object of the present invention is to provide a power semiconductor module capable of reducing insulation failure.

According to the present invention, a power semiconductor module comprises: a heat dissipation plate; an insulating wiring board having an upper electrode and a lower electrode, the lower electrode joined to the heat dissipation plate via a first solder; a semiconductor chip joined to the upper electrode via a second solder; a first low-k dielectric film coating sides of the lower electrode and the first solder; a second low-k dielectric film coating sides of the semiconductor chip and the second solder; a case on the heat dissipation plate and surrounding the insulating wiring board and the semiconductor chip; and an insulator filled in the case and coating the insulating wiring board, the semiconductor chip, and the first and second low-dielectric films.

The present invention makes it possible to reduce insulation failure.

Other and further objects, features and advantages of the invention will appear more fully from the following description.

DETAILED DESCRIPTION OF THE PREFERRED EMBODIMENTS

A power semiconductor module according to the embodiments of the present invention will be described with reference to the drawings. The same components will be denoted by the same symbols, and the repeated description thereof may be omitted.

First Embodiment

Figure 1:
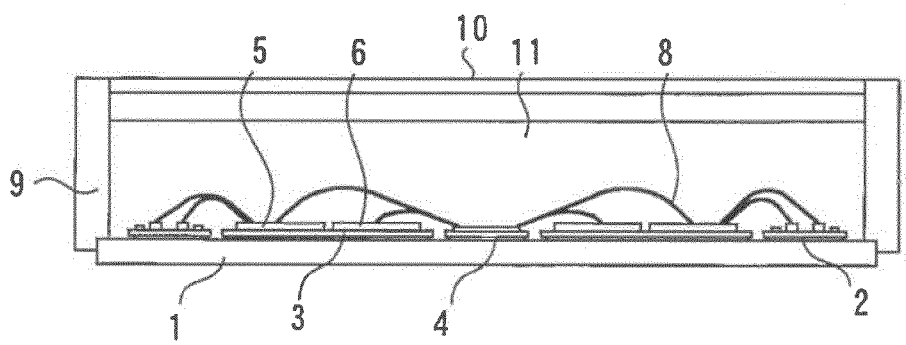
FIG. 1 is a sectional view showing a power semiconductor module according to the first embodiment.
Figure 2:
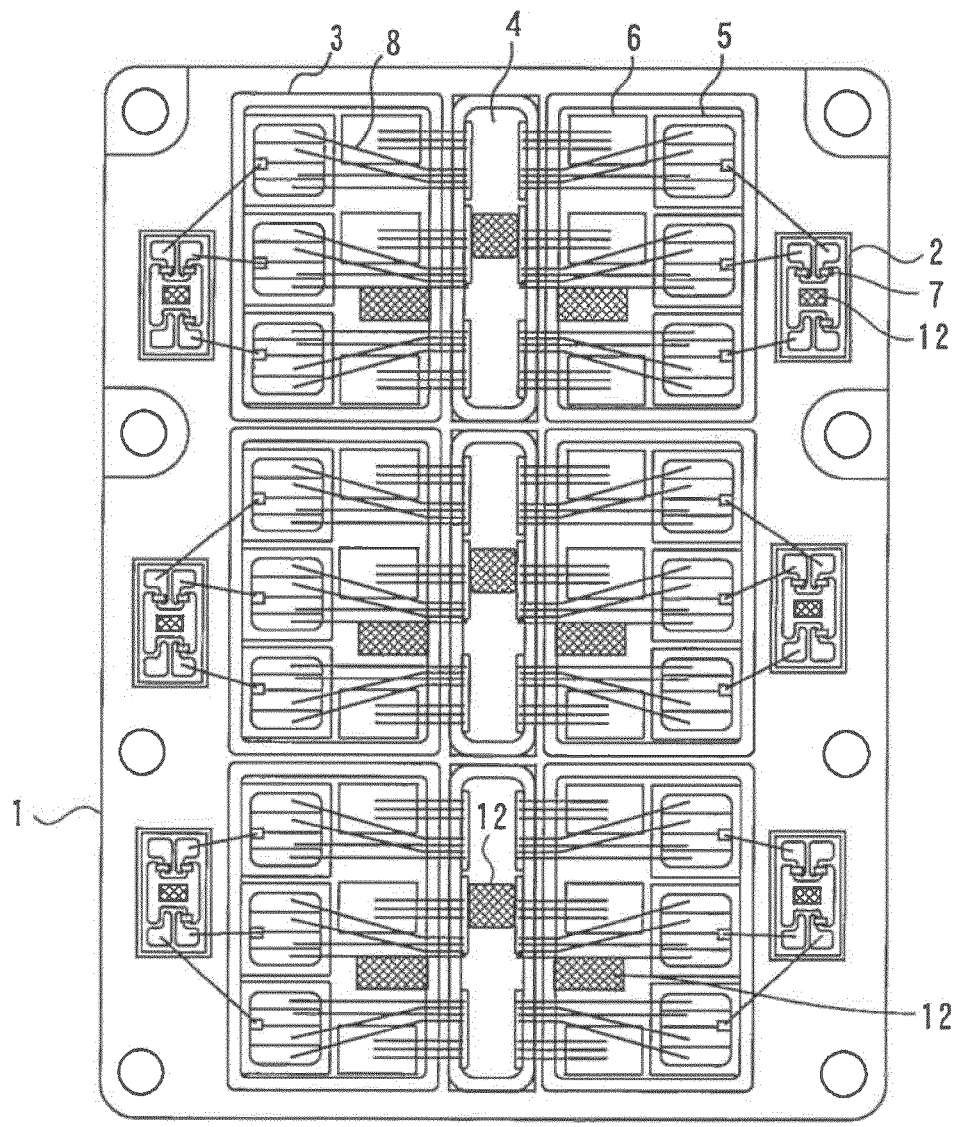
FIG. 2 is a top view showing a power semiconductor module according to the first embodiment.
Figure 3:
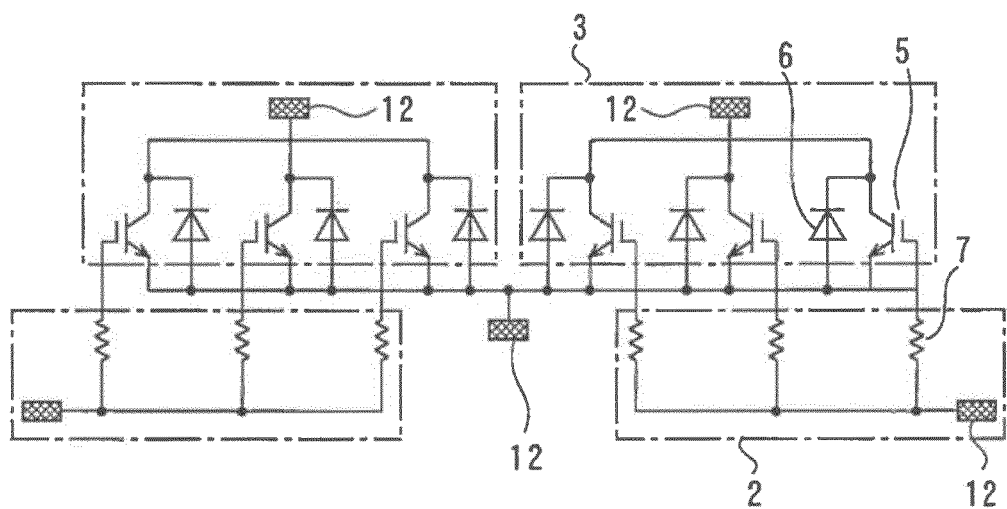
FIG. 3 is an equivalent circuit of one circuit block in the power semiconductor module shown in FIG. 2.

FIG. 1 is a sectional view showing a power semiconductor module according to the first embodiment, and FIG. 2 is a top view thereof. The power semiconductor module incorporates circuit blocks configured to obtain high breakdown voltage and large current characteristics by connecting a plurality of insulating-gate bipolar transistors (IGBT) in parallel and providing common collector terminals, emitter terminals, and gate terminals. FIG. 3 is an equivalent circuit of one circuit block in the power semiconductor module shown in FIG. 2.

On a heat dissipation plate 1, drive circuit wiring boards 2, power semiconductor circuit wiring boards 3, and relay circuit wiring boards 4 are installed. These circuit wiring boards are insulating wiring boards such as ceramics having conductive patterns of cupper, aluminum, or the like on both surfaces. On the power semiconductor circuit wiring boards 3, IGBTs 5 and free wheel diodes 6 are joined. Chip resistors 7 are joined onto the drive circuit wiring boards 2.

The emitters of the IGBTs 5 and the anodes of the free wheel diodes 6 are connected to the conductive patterns of the relay circuit wiring boards by Al wires 8. The gates of the IGBTs 5 are connected to the conductive patterns of the drive circuit wiring board 2 by Al wires 8. The collectors of the IGBTs 5 and the cathodes of the free wheel diodes 6 are mutually connected via the conductive patterns of the power semiconductor circuit wiring boards 3.

A plastic case 9 is provided on the heat dissipation plate 1 so as to surround the drive circuit wiring board 2, the power semiconductor circuit wiring boards 3, and the relay circuit wiring boards 4, and a cover 10 is placed on the upper portion of the case 9. The case 9 is filled with silicone gel 11 for maintaining air tightness and insulation. Each circuit wiring board is equipped with an electrode terminal joining region 12. To the electrode terminal joining region 12, an electrode terminal (not shown) for realizing electrical connection to the exterior is installed. Here, although the power semiconductor circuit wiring board 3 and the relay circuit wiring board 4 are separately installed on different insulating wiring board, the both may be provided on different conductive pattern forming regions of one insulating wiring board.

Figure 4:
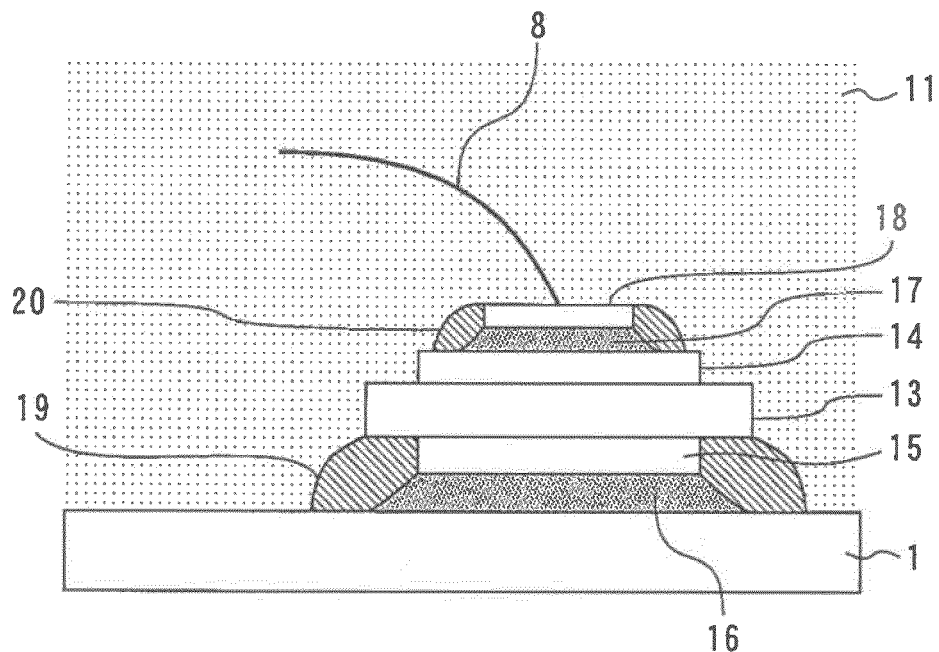
FIG. 4 is an enlarged sectional view showing a power semiconductor module according to the first embodiment.

FIG. 4 is an enlarged sectional view showing a power semiconductor module according to the first embodiment. An insulating wiring board 13 has an upper electrode 14 and a lower electrode 15. The lower electrode 15 of the insulating wiring board 13 is joined to the heat dissipation plate 1 via a solder 16. A semiconductor chip 18 made of Si is joined on the upper electrode 14 of the insulating wiring board 13 via solder 17. An Al wire 8 is bonded to the semiconductor chip 18. The insulating wiring board 13 corresponds to the power semiconductor circuit wiring board 3 shown in FIGS. 1 to 3, and the semiconductor chip 18 corresponds to the IGBT 5 or the free wheel diode 6 shown in FIGS. 1 to 3.

A low-k dielectric film 19 coats sides of the lower electrode 15 and the solder 16. A low-k dielectric film 20 coats sides of the semiconductor chip 18 and the solder 17. The low-k dielectric films 19 and 20 are composed of one of silicone rubber, polyimide, and epoxy resin. In particular, when silicone rubber is used as the low-k dielectric films 19 and 20, assembly is facilitated. When polyimide is used, heat resistance is improved. When epoxy resin is used, heat cycling characteristics are improved. A silicone gel 11 (flexible insulator) filled in the case 9 coats the insulating wiring board 13, the semiconductor chip 18, and the low-k dielectric films 19 and 20.

As described above, in the present embodiment, the low-k dielectric film 19 coats the sides of the solder 16 and the lower electrode 15, and the low-k dielectric film 20 coats the sides of the solder 17 and the semiconductor chip 18. Thereby, the generation of bubbles from the solder 17 can be suppressed. Therefore, the insulation failure can be reduced, and the life elongation of the products becomes feasible.

Second Embodiment

Figure 5:
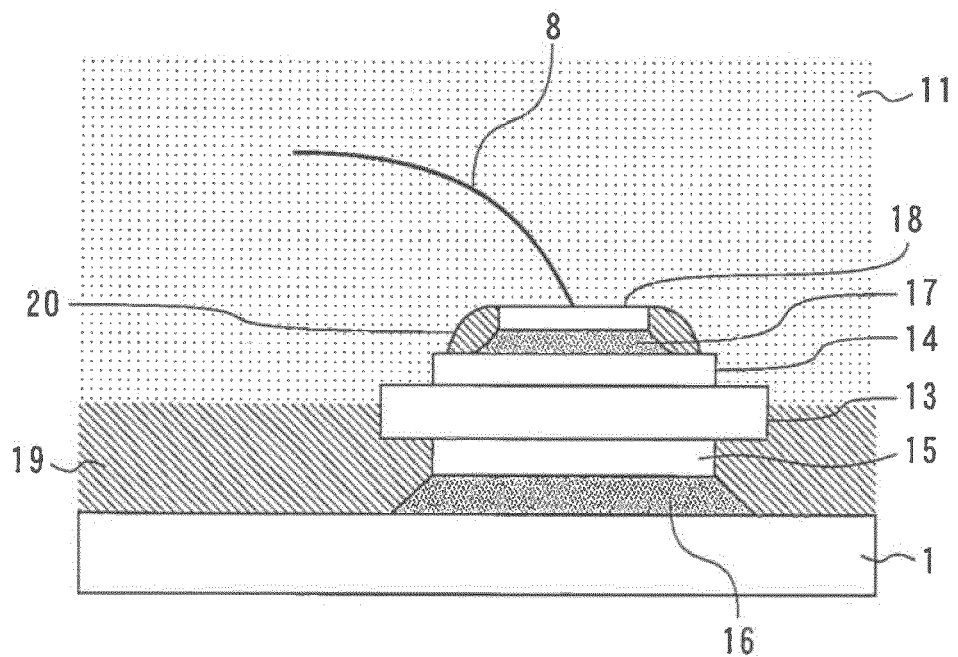
FIG. 5 is an enlarged sectional view showing a power semiconductor module according to the second embodiment.

FIG. 5 is an enlarged sectional view showing a power semiconductor module according to the second embodiment. The low-k dielectric film 19 coats the entire upper surface of the heat dissipation plate 1 in the lower side than the insulating wiring board 13. Other configurations are identical to the configurations of the first embodiment. Thereby, the generation of bubbles from the solder 16 can be more reliably suppressed than the first embodiment.

Third Embodiment

Figure 6:
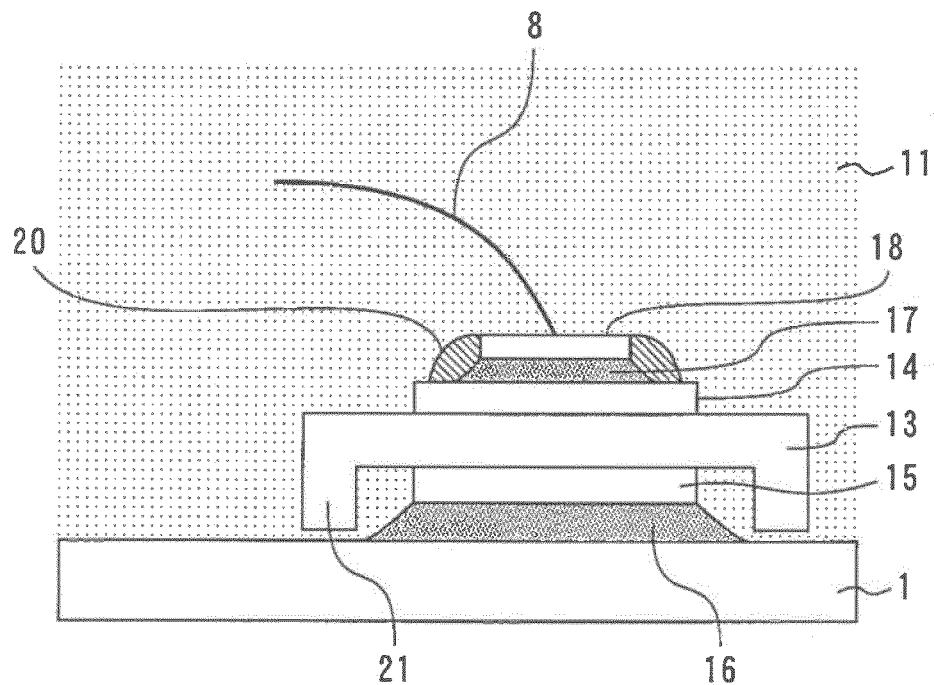
FIG. 6 is an enlarged sectional view showing a power semiconductor module according to the third embodiment.

FIG. 6 is an enlarged sectional view showing a power semiconductor module according to the third embodiment. Although the low-k dielectric film 19 is not formed, the insulating wiring board 13 has further a convex portion 21 protruded downward from the peripheral portion of the lower surface. Other configurations are identical to the configurations of the first embodiment. Thereby, bubbles generated from the solder 16 are stopped on the lower surface side of the insulating wiring board 13 by the convex portion 21. Therefore, insulation failure can be reduced.

Fourth Embodiment

Figure 7:
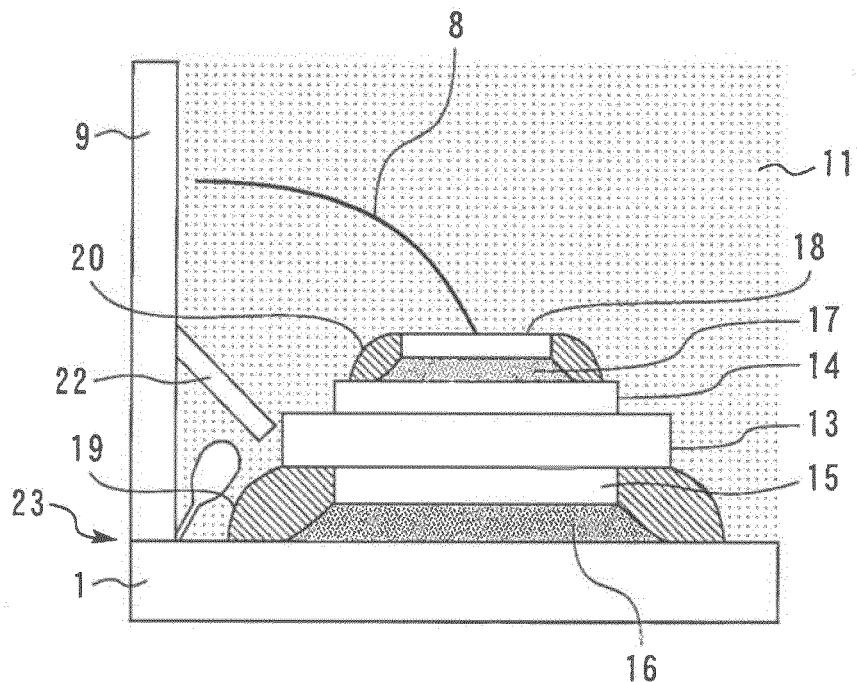
FIG. 7 is an enlarged sectional view showing a power semiconductor module according to the fourth embodiment.

FIG. 7 is an enlarged sectional view showing a power semiconductor module according to the fourth embodiment. A partition 22 is formed on the internal wall of the case 9. The partition 22 is placed between the joining portion 23 of the heat dissipation plate 1 with case 9 and the upper surface of the insulating wiring board 13. Other configurations are identical to the configurations of the first embodiment.

Bubbles generated from the joining portion 23 are stopped in the case 9 side by the partition 22, and do not move to the upper surface of the insulating wiring board 13. Therefore, insulation failure can be further reduced.

The distance from the joining portion 23 to the upper surface of the insulating wiring board 13 is longer than the distance from solders 16 and 17 to the upper surface of the insulating wiring board 13. Therefore, the possibility that the bubbles cause insulation failure is low. However, the present embodiment is effective when further high reliability is required.

The configuration of the fourth embodiment can be applied not only to the first embodiment, but also to any of second and third embodiments.

Fifth Embodiment

Figure 8:
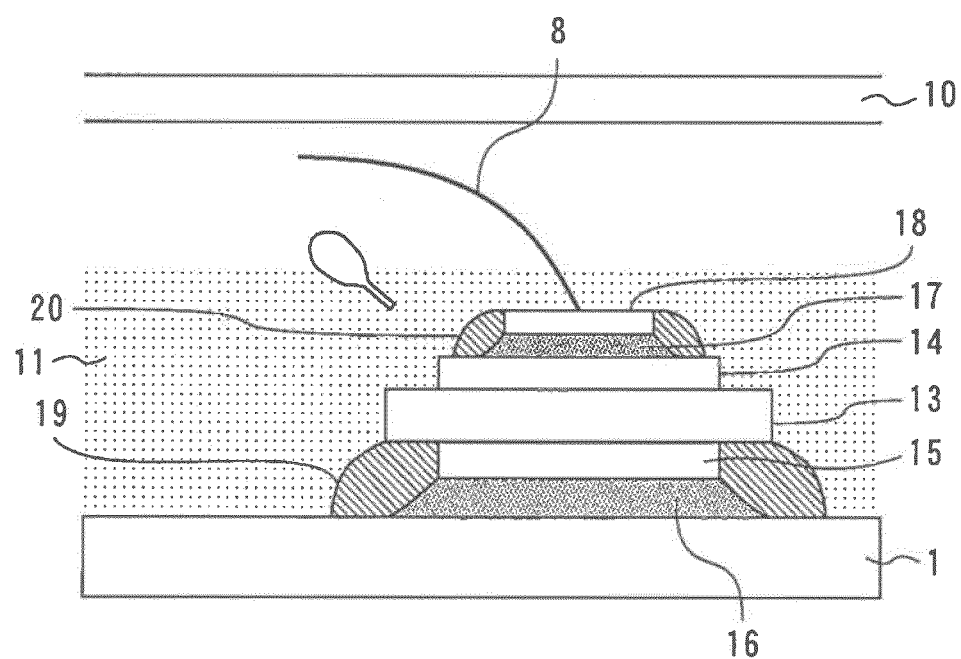
FIG. 8 is an enlarged sectional view showing a power semiconductor module according to the fifth embodiment.

FIG. 8 is an enlarged sectional view showing a power semiconductor module according to the fifth embodiment. In the first to fourth embodiment, the silicone gel 11 coats all the Al wires 8. Whereas in the fifth embodiment, the height of the silicone gel 11 is limited to be about several millimeters from the upper surface of the semiconductor chip 18. Thereby, a part of the Al wires 8 is exposed from the silicone gel 11. Other configurations are identical to the configurations of the first embodiment.

Even if bubbles are generated from solders 16 and 17 due to defective forming of low-k dielectric films 19 and 20, the bubbles easily reach the upper surface of the silicone gel 11, and released into the air. Therefore, insulation failure can be further reduced.

The configuration of the fifth embodiment can be applied not only to the first embodiment, but also to any of second to fourth embodiments.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-091291, filed on Apr. 12, 2010 including specification, claims, drawings and summary, on which the Convention priority of the present application is based, are incorporated herein by reference in its entirety.

What is claimed is:

1. A power semiconductor module comprising:
   a heat dissipation plate;
   an insulating wiring board having an upper electrode and a lower electrode, the lower electrode joined to the heat dissipation plate via a first solder;
   a semiconductor chip joined to the upper electrode via a second solder;
   a low-k dielectric film coating sides of the semiconductor chip and the second solder;
   a case on the heat dissipation plate and surrounding the insulating wiring board and the semiconductor chip; and
   a silicone gel filled in the case and coating the insulating wiring board, the semiconductor chip, and low-k dielectric film,
   wherein the insulating wiring board has a convex portion protruded downward from a peripheral portion of a lower surface of the insulating wiring board.

2. The power semiconductor module according to claim 1, wherein the low-k dielectric film is composed of one of silicone rubber, polyimide, and epoxy resin.

3. The power semiconductor module according to claim 1, wherein the low-k dielectric film coats an entire upper surface of the heat dissipation plate in a lower side than the insulating wiring board.

4. The power semiconductor module according to claim 1, further comprising a wire bonded to the semiconductor chip, wherein a part of the wire is exposed from the silicone gel.

5. A power semiconductor module comprising:
   a heat dissipation plate;
   an insulating wiring board having an upper electrode and a lower electrode, the lower electrode joined to the heat dissipation plate via a first solder:
   a semiconductor chip joined to the upper electrode via a second solder;
   a first low-k dielectric film coating sides of the lower electrode and the first solder;
   a second low-k dielectric film coating sides of the semiconductor chip and the second solder;
   a case on the heat dissipation plate and surrounding the insulating wiring hoard and the semiconductor chip;

a silicone gel filled in the case and coating the insulating wiring board, the semiconductor chip, and the first and second low-k dielectric films; and a partition placed between a joining portion of the heat dissipation plate with the case and an upper surface of the insulating wiring board.

6. The power semiconductor module according to claim 5, wherein the first and second low-k dielectric films are composed of one of silicone rubber, polyimide, and epoxy resin.

7. The power semiconductor module according to claim 5, wherein the first low-k dielectric film coats an entire upper surface of the heat dissipation plate in a lower side than the insulating wiring board.

8. The power semiconductor module according to claim 5, further comprising a wire bonded to the semiconductor chip, wherein a part of the wire is exposed from the silicone gel.

* * * * *